United States Patent [19]

Noujaim

[11] Patent Number: 4,768,018
[45] Date of Patent: Aug. 30, 1988

[54] ANALOG TO DIGITAL CONVERTER FOR AN ELECTRONIC CIRCUIT BREAKER WITH OUT-OF-SUPPLY-RANGE INPUT SIGNALS

[75] Inventor: Sharbel E. Noujaim, Clifton Park, N.Y.

[73] Assignee: General Electric Company, Schenectady, N.Y.

[21] Appl. No.: 129,616

[22] Filed: Dec. 7, 1987

Related U.S. Application Data

[63] Continuation of Ser. No. 74,103, Jul. 16, 1987, abandoned.

[51] Int. Cl.[4] ............................................. H03M 1/12
[52] U.S. Cl. ...................... 340/347 AD; 340/347 NT
[58] Field of Search ................. 340/347 AD, 347 CC, 340/347 NT; 375/27

[56] References Cited

U.S. PATENT DOCUMENTS 4,542,354 9/1985 Robinton et al. ............ 340/347 AD
4,573,037 2/1986 Robinton et al. ............ 340/347 AD

OTHER PUBLICATIONS

Candy, James C., "A Use of Limit Cycle Oscillations to Obtain Robust Analog-to-Digital Converters", IEEE Trans, on Comm. vol. COM-22, No. 3; p.298.

Inose, Hiroshi et al, "A Unity Bit Coding Method by Negative Feedback", Proceedings of the IEEE, Nov. 1963, pp. 1524–1535.

Brainard, Ralph C. et al "Direct-Feedback Coders: Design and Performance with Television Signals"; Proc. of the IEEE May 1969, pp. 776–786.

*Primary Examiner*—William M. Shoop, Jr.
*Assistant Examiner*—Richard K. Blum
*Attorney, Agent, or Firm*—Lawrence D. Cutter; James C. Davis, Jr.; Marvin Snyder

[57] ABSTRACT

An oversampled delta-sigma analog to digital converter is used in conjunction with bias resistive means and a single bit digital to analog converter in a feedback loop to permit the utilization of the converter in a system in which the converter elements are supplied with power from the same source which supplies the analog input signal to the converter. Accordingly, a minimum number of on-chip circuit components are provided to extend the operational utility of delta-sigma converter/-modulation devices and particularly to permit their utilization in electronic circuit breaker chips and devices.

6 Claims, 1 Drawing Sheet

ANALOG TO DIGITAL CONVERTER FOR AN ELECTRONIC CIRCUIT BREAKER WITH OUT-OF-SUPPLY-RANGE INPUT SIGNALS

This application is a continuation of application Ser. No. 074,103, filed July 16, 1987, now abandoned.

BACKGROUND OF THE INVENTION

The present invention is related to an oversampled analog to digital converter which is particularly useful in electronic circuit breaker devices. More particularly, the present invention is related to delta-sigma (or $\Delta - \Sigma$) modulator devices with provision for input level shifting.

In an electronic circuit breaker, current transformers are typically employed to generate a voltage that is linearly related to the current level flowing through the bus bars in a multi-phase system. This voltage is produced by supplying the secondary current from the current transformers to "burden resistors" at the input pins of an electronic circuit breaker chip. In this fashion, a signal is provided to the circuit breaker chip which is indicative of the current level in a multi-phase power system. However, this same secondary current from the current transformers is also used to generate the power supply to the circuit breaker chip which includes analog to digital converter circuitry. The power is supplied by the use of conventional power supply arrangements comprising diodes arranged in a full wave rectifier configuration, zener diodes for clamping, and capacitive and resistive filter combinations for smoothing. Such power supply arrangements are conventional and well known. However, the utilization of secondary current from the current transformers to supply both signal and power levels to a circuit breaker chip poses significant problems. For example, if the power supply voltage is between 0 and V volts, the input signal level will be between 0 and $-V$ volts. Thus, the problem posed is how to digitize a signal which is outside the range of the reference voltage of the analog to digital converter.

Even more particularly, it is noted that it is desirable to employ delta-sigma analog to digital conversion methods and systems because these are particularly applicable to power system applications since they exhibit high accuracy and a wide dynamic range. Such advantages appear to be appreciated, for example, in U.S. Pat. No. 4,542,354 issued Sept. 17, 1985 to Robinton et al. and in U.S. Pat. No. 4,573,037 issued Feb. 25, 1986, also to Robinton et al. However, the teachings of these patents are not directed to the problem of out-of-supply-range input signals. Nonetheless, it is noted therein that delta-sigma modulation methods are known in the art.

It would appear that there are several ways to solve the out-of-supply-range problem such as the use of a separate power supply also possibly entailing the utilization of more than one set of current transformers. However, most of the alternate methods would appear to employ, out of necessity, off-chip components or extra circuitry on the chip that makes such systems difficult to fabricate economically. Accordingly, it is seen that it is desirable to be able to solve the out-of-supply-range problem in a simple, economical fashion employing on-chip components.

SUMMARY OF THE INVENTION

In accordance with a preferred embodiment of the present invention, an oversampled analog to digital converter, such as a delta-sigma configuration, is used in combination with a specific bias resistor connected to the supply voltage in further conjunction with a simple CMOS (complementary metal oxide semiconductor) inverter in a feedback loop in which the inverter actually functions as a single bit digital to analog converter.

More particularly, a preferred embodiment of the present invention employs a set of three resistors, each of which is connected to the inverting input of an operational amplifier operating as an integrator. The first two of these resistive elements exhibits the same resistance, with a third resistive element being connected to the supply voltage $V_{DD}$. One of the first two resistors is connected to the analog input signal, with the third resistor being connected in a feedback loop which includes a CMOS inverter operating as a single bit digital-to-analog converter. The output of the integrator is supplied to the inverting input of a comparator which also receives a voltage $V_{gg}$ which is also supplied to the non-inverting input of the operational amplifier employed in the integrator. The output of the comparator is supplied to a clocked flip-flop type device which produces the desired digital output. The output of the flip-flop device is also supplied to the inverter mentioned above. In accordance with the present invention, the voltage $V_{gg}$ is selected to be equal to $V_{DD}/2$. The circuit equations (given below) demonstrate that the desired effect is achieved with this value of $V_{gg}$. It should also be borne in mind that the supply voltage $V_{DD}$ is also employed to power the various components of the converter.

Accordingly, it is an object of the present invention to provide an analog to digital converter circuit which is particularly suitable for use in electronic circuit breaker applications.

It is yet another object of the present invention to construct an analog to digital converter circuit in which the power supply for the circuit and its signal input level is derived from the same source.

It is a still further object of the present invention to level shift the analog input of an analog to digital converter in a simple, elegant fashion employing a minimum number of circuit components, and in particular, employing circuit components which can be disposed on an integrated circuit chip.

It is also an object of the present invention to be able to extend the functionality of delta-sigma analog to digital conversion devices.

Lastly, but not limited hereto, it is an object of the present invention to level shift input signals from $-V$ volts to $+V$ volts with a minimum number of on chip circuit components.

DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
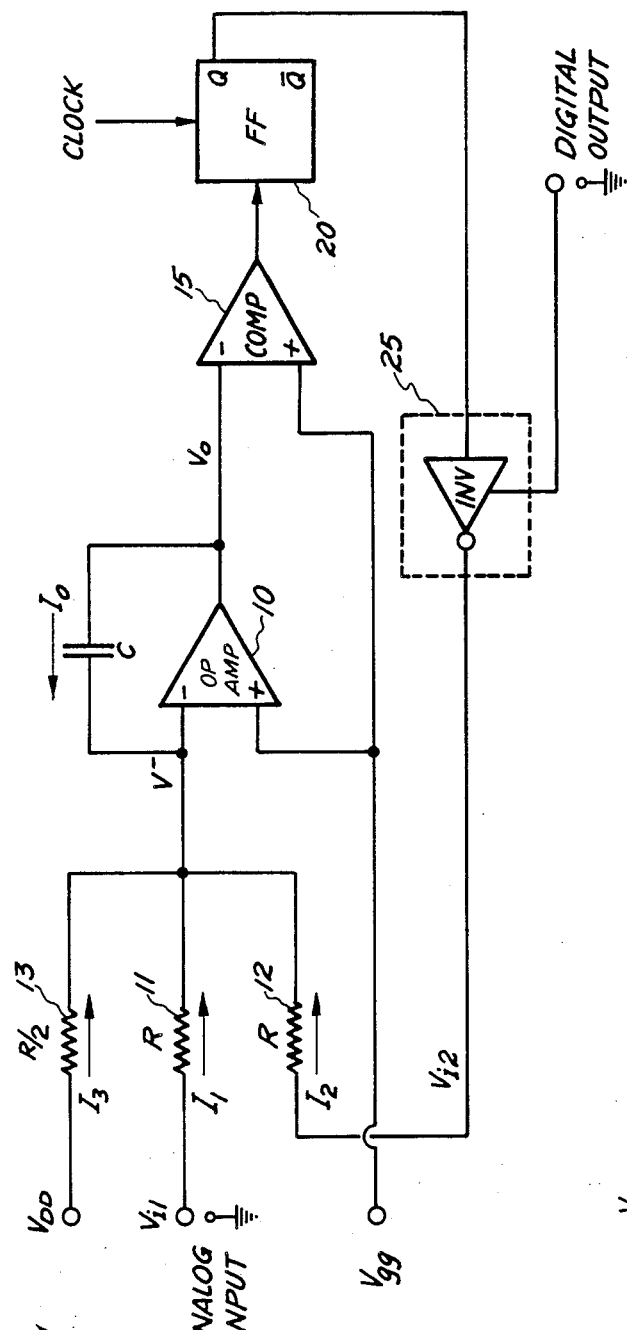
FIG. 1 is an electrical schematic diagram of an analog to digital converter in accordance with a preferred embodiment of the present invention.

FIG. 1 illustrates a preferred embodiment of the present invention. In this embodiment, a set of three resistive elements 11, 12 and 13 are employed at the input end of operational amplifier 10. Each of resistors 11, 12 and 13 have one of their ends connected to the inverting input of operational amplifier 10. In FIG. 1, this input is denoted as node $V^-$. Resistive elements 11 and 12 exhibit the same resistance, R, while resistive element 13 exhibits a resistance of R/2. The analog input signal $V_{i1}$ is supplied to the side of resistive element 11 which is not connected to node $V^-$. An important part of the present invention is the inclusion of bias resistive element 13 which is connected to supply voltage $V_{DD}$, which is typically approximately 5 volts. As seen in FIG. 1, resistive elements 11, 12 and 13 are indicated as carrying current $I_1$, $I_2$ and $I_3$, respectively, in the directions shown. These current designations are relevant for the discussion below concerning the desired operation of the circuit, as indicated per the circuit equations. Lastly, with respect to the resistive circuit elements shown, it is noted that resistive element 12 having a resistance R, is connected in a feedback loop from the output of inverter 25, as shown. Further details with respect to inverter 25 are provided below.

Node $V^-$ for resistive elements 11, 12 and 13 is also attached to the inverting input of operational amplifier 10. The output node of operational amplifier 10 is also connected in a feedback path to its inverting input through capacitor C, through which current $I_o$ flows, as shown. Thus, as is conventionally known, operational amplifier 10, together with capacitor C operates to provide an analog integrating function. Operational amplifier 10, as is common with such devices, also possesses a non-inverting input (designated with the "+" sign) to which a voltage $V_{gg}$ is supplied. In accordance with the present invention, the analysis provided below indicates that the voltage $V_{gg}$ is specifically selected to be equal to $V_{DD}/2$. This voltage may be supplied by any convenient means, include a voltage divider.

The output of operational amplifier 10, namely $V_o$, is supplied to the inverting input of comparator 15 which also receives voltage $V_{gg}$ at its non-inverting input. Comparator 15 operates to produce an output signal that changes state (5 V to 0V) whenever voltage $V_o$ exceeds $V_{gg}$. This signal is sampled by flip-flop 20 which is controlled by a clock. As is conventional in delta-sigma modulation systems, output 20 produces a string of single bit signals which, over a period of time, are representative of the amplitude of the input signal $V_{i1}$.

Most importantly for the present invention, however, it is desirable to note the presence of inverter 25 receiving its output signal from the non-inverted output, Q, from flip-flop means 20. The output of inverter 25, namely $V_{i2}$, as shown, is supplied to resistive element 12, whose other terminal is connected to node $V^-$. It is noted that since $V_{DD}$ also supplies the power for operating operational amplifier 10, comparator 15, inverter 25 and flip-flop 20, that inverter 25 effectively operates as a single bit digital to analog conversion device feeding part of the converted digital signal back to the input of operational amplifier 10. It will thus be seen in the analysis provided below that the combination of bias shift resistive element 13 and inverter 25 provides the desired level shifting described above with a minimum number of circuit components.

It is also noted that, as is conventional for delta-sigma modulator circuits, the clock input to flip-flop means 20 operates at a frequency which is typically several times the Nyquist frequency of the analog input signal. This mode of operation accounts for the term "oversampled" which is typically applied to modulator systems of the kind discussed herein.

An analysis of the circuit shown in FIG. 1 is also particularly desirable for understanding the level shift operation. In particular, it is seen that a Kirchoff current law equation may be written at node $V^-$ as follows:

$$I_1 + I_2 + I_3 + I_o = 0 \tag{1}$$

In particular, it is seen in the above that the individual currents may be written as follows:

$$I_1 = (V_{i1} - V_{gg})R_1 \tag{2}$$

$$I_2 = (V_{i2} - V_{gg})R_1 \tag{3}$$

$$I_3 = (V_{DD} - V_{gg})R_2 \tag{4}$$

$$I_o = (V_o - V_{gg})SC \tag{5}$$

In the above, $R_1 = R$ and $R_2 = R/2$, where R is as indicated above. Also in the above, S represents frequency and C is the capacitance of the capacitor in the feedback loop shown in FIG. 1 between nodes $V_o$ and $V^-$. It is also noted that in one embodiment of the present invention, R is approximately 122 kilohms. In particular, in the present invention, $V_{gg}$ is selected to be $V_{DD}/2$. Therefore, $I_3$ is given by $V_{DD}/2R_2$. By substituting the values of $I_1$, $I_2$, $I_3$ and $I_o$ in equation (1), the output voltage can be written as:

$$V_o = -1/SR_1C\,[V_{i1} + V_{i2} + V_{DD}] = V_{gg}[1 + 2/SR_1C] \tag{6}$$

From equation (6), it is seen that the output voltage can be rewritten as $$V_o = -1/SR_1C\,[V_{ilp} + V_{i2}] + V_{gg}[1 + 2/SR_1C] \tag{7}$$

where $V_{ilp} + V_{i1} = V_{DD}$. $V_{i1}$ is the signal input voltage and can vary between 0 and $-V_{DD}$. Therefore, $V_{ilp}$ varies between $V_{DD}$ and 0. Thus, by using this circuit configuration, it is seen that there is no more out-of-range signals applied to the input of the delta-sigma converter.

Figure 2:
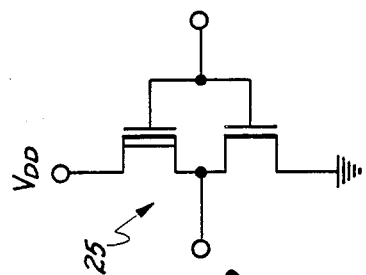
FIG. 2 is an electrical circuit schematic diagram more particularly indicating the construction of a CMOS inverter circuit.

The output of the one bit digital to analog converter (actually inverter 25) pingpongs between the values of 0 volts and $V_{DD}$ volts, depending upon the sample values at the input of flip-flop means 20. For this particular application, it has been shown that a CMOS inverter in the feedback loop achieves that function without requiring a special switch that selects between two accurate reference voltages. This simplifies the circuit design. An appropriate CMOS inverter circuit for inverter 25 is shown in FIG. 2.

From the above, it should be appreciated that the circuit shown in FIG. 1 provides the appropriately desired level shifting for the input voltage that is desired. It is further seen that the circuit shown in FIG. 1 is particularly applicable for use in electronic circuit breaker devices or other such devices in which signal voltages and power supply voltages are derived from the same source. It is also seen that the circuit of FIG. 1 extends the applicability of delta-sigma modulation devices through use of a feedback loop employing a single bit digital to analog converter in conjunction with a bias resistor attached to supply voltage levels.

While the invention has been described in detail in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. An analog to digital converter comprising:
    a set of three two-terminal resistive elements having a first terminal of each element connected to a common electrical node, wherein the first two of said resistive elements have the same resistance value and the third of said resistive elements has a resistive value of half of either of the first two resistive elements;
    analog integrator means having inverting and non-inverting inputs, said inverting input being connected to said common electrical node with said three two terminal resistive elements;
    analog comparator means also having inverting and non-inverting input nodes, said inverting input node of said comparator means being connected to the output of said integrator means;
    single bit clocked flip-flop means operating to change output states in response to the output of said comparator means;
    inverting means connected at its input to the non-inverted output of said flip-flop means and connected at its output to the second terminal of said second resistive element;
    means for supplying a voltage $V_{DD}$ to the second terminal of said third resistive means;
    means for supplying a voltage $V_{DD}/2$ to the non-inverting nodes of said integrator means and said comparator means,
    whereby an analog signal applied to the second terminal of said first resistive element is converted to a serial binary signal from said flip-flop means in which the number of bits is representative, over a period of time, of the level of said analog signal.

2. The converter of claim 1 in which said integrator means comprises an operational amplifier having a capacitive element connected between its output and an inverting input of said operational amplifier.

3. The converter circuit of claim 1 in which voltages $V_{DD}$ and $V_{DD}/2$ are supplied from the same source.

4. The converter circuit of claim 1 in which said analog mean, said comparator means and said flip-flop means and said inverting means receive power from the same source that supplies said analog input signal.

5. The converter circuit of claim 1 in which said clock of said flip-flop means is operable at a frequency greater than the Nyquist frequency of said input signal.

6. An analog to digital converter comprising:
    an over-sampled analog-to-digital converter including an integrating operational amplifier with inverting and non-inverting inputs, an analog comparator also having inverting and non-inverting input nodes, said inverting input of said comparator being coupled to the output of said integrating amplifier and a single bit clocked flip-flop means coupled to the output of said comparator so as to change output states in response to the output of said comparator:
    inversion means coupled at its input to the output of said flip-flop means;
    means for supplying a voltage $V_{DD}/2$ to the non-inverting input nodes of said operational amplifier and said comparator; and
    bias means for receiving voltage signals from an analog input source, from a supply having a voltage $V_{DD}$ and from the output of said inversion means, and for supplying a current to the inverting input node of said operational amplifier, said current being the sum of individual currents each individual current being proportional to one of said voltage $V_{DD}$, said analog input and said inverter output voltage.

* * * * *